(12) United States Patent
Kotera et al.

(10) Patent No.: US 9,041,392 B2
(45) Date of Patent: May 26, 2015

(54) CURRENT SENSOR

(71) Applicant: ALPS GREEN DEVICES CO., LTD., Tokyo (JP)

(72) Inventors: Yasuo Kotera, Miyagi-ken (JP); Manabu Tamura, Miyagi-ken (JP); Hisanori Kiyomatsu, Miyagi-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 217 days.

(21) Appl. No.: 13/939,075

(22) Filed: Jul. 10, 2013

(65) Prior Publication Data
US 2013/0293224 A1 Nov. 7, 2013

Related U.S. Application Data

(63) Continuation of application No. PCT/JP2012/050090, filed on Jan. 5, 2012.

(30) Foreign Application Priority Data

Jan. 11, 2011 (JP) ................. 2011-003045

(51) Int. Cl.
*G01R 33/02* (2006.01)
*G01R 31/28* (2006.01)
(Continued)

(52) U.S. Cl.
CPC ........ *G01R 31/2829* (2013.01); *G01R 19/0092* (2013.01); *G01R 19/10* (2013.01); *G01R 15/205* (2013.01)

(58) Field of Classification Search
CPC ............... G01R 19/10; G01R 31/2829; G01R 19/0092; G01R 15/205
See application file for complete search history.

(56) References Cited

U.S. PATENT DOCUMENTS 3,074,634 A * 1/1963 Gamo ....................... 235/462.01
4,673,274 A * 6/1987 Nagaoka et al. ............... 396/120
(Continued)

FOREIGN PATENT DOCUMENTS

JP 2002-156390 5/2002
JP 2003-194598 7/2003
(Continued)

OTHER PUBLICATIONS

Search Report dated Apr. 3, 2012 from International Application No. PCT/JP2012/050090.

*Primary Examiner* — Jermele M Hollington
*Assistant Examiner* — Hoang X Nguyen
(74) *Attorney, Agent, or Firm* — Beyer Law Group LLP

(57) ABSTRACT

There is provided a current sensor capable of performing malfunction determination with high accuracy even under the influence of an adscititious magnetic field. A current sensor includes first and second current sensor units, a computation unit, a storage unit, and a determination processing unit. The first current sensor unit measures a target current. The first and second current sensor units have almost the same sensitivity. The computation unit calculates and outputs an addition value and a difference value of outputs of the first and second current sensor units. In the storage unit, the addition and difference values output from the computation unit are stored. The determination processing unit determines whether a malfunction has occurred by using the addition and difference values stored in the storage unit. The determination processing unit determines that a malfunction has occurred, in a case where there is a correlation between the addition and difference values.

15 Claims, 14 Drawing Sheets

(51) Int. Cl.
  *G01R 19/00* (2006.01)
  *G01R 19/10* (2006.01)
  *G01R 15/20* (2006.01)

(56) References Cited

U.S. PATENT DOCUMENTS

| | | | |
|---|---|---|---|
| 5,539,178 A * | 7/1996 | Taneda et al. | 219/69.13 |
| 6,750,953 B1 * | 6/2004 | Douglas | 356/4.08 |
| 7,184,238 B1 * | 2/2007 | Ostwald et al. | 360/69 |
| 2002/0191503 A1 * | 12/2002 | Kataoka et al. | 369/44.29 |
| 2003/0137855 A1 * | 7/2003 | Miguchi | 363/65 |
| 2005/0073295 A1 * | 4/2005 | Hastings et al. | 324/117 R |
| 2006/0245221 A1 * | 11/2006 | Ohshima et al. | 363/131 |
| 2009/0040800 A1 * | 2/2009 | Sonnaillon et al. | 363/89 |
| 2013/0265036 A1 * | 10/2013 | Friedrich et al. | 324/207.2 |
| 2013/0286524 A1 * | 10/2013 | Krenz et al. | 361/100 |

FOREIGN PATENT DOCUMENTS

| | | |
|---|---|---|
| JP | 2005-354773 | 12/2005 |
| JP | 2009/139223 | 6/2009 |
| JP | 2010-139244 | 6/2010 |

* cited by examiner

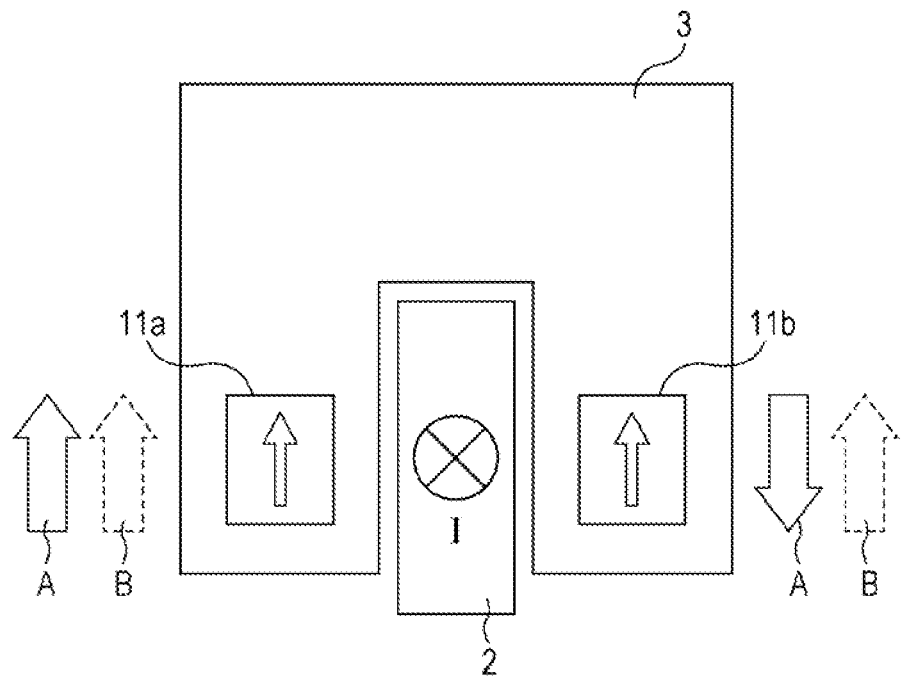
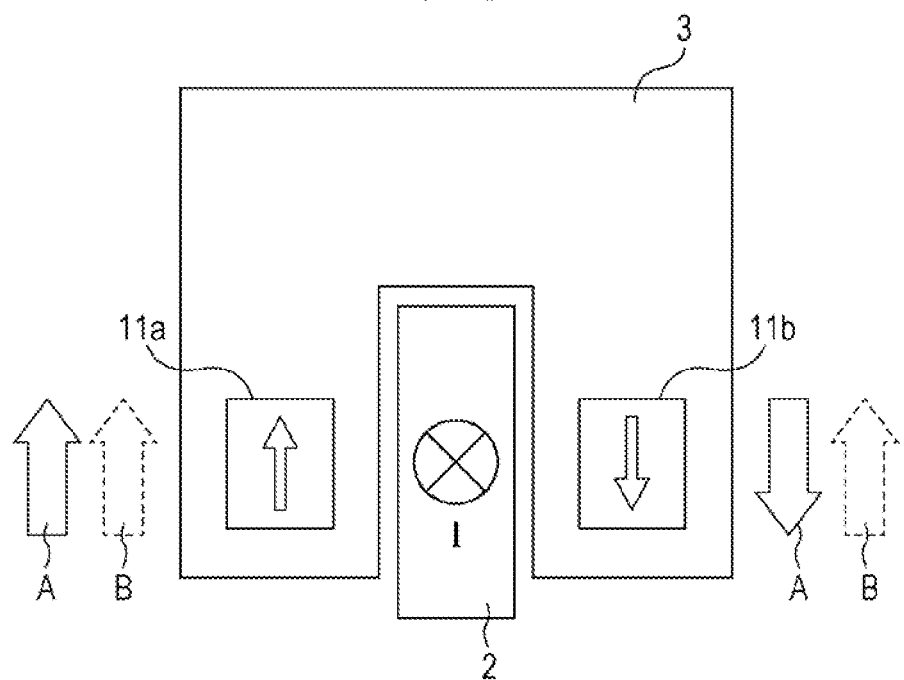

and hybrid cars, a relatively large current is used. Thus, a current sensor capable of measuring large current in a non-contact manner is sought for such a use. As such a current sensor, a sensor using a method in which a change in magnetic field is detected by a magnetic sensor has been proposed, the change being caused by a target current to be measured. For example, Japanese Unexamined Patent Application Publication No. 2002-156390 discloses a current sensor in which a magnetic resistance element is used as an element for a magnetic sensor.
CURRENT SENSOR

CLAIM OF PRIORITY

This application is a Continuation of International Application No. PCT/JP2012/050090 filed on Jan. 5, 2012, which claims benefit of Japanese Patent Application No. 2011-003045 filed on Jan. 11, 2011. The entire contents of each application noted above are hereby incorporated by reference.

BACKGROUND OF THE INVENTION

1. Field of the Invention

The present invention relates to a current sensor configured to measure a target current to be measured, in a non-contact manner.

2. Description of the Related Art

In a field such as motor drive technologies for electric cars and hybrid cars, a relatively large current is used. Thus, a current sensor capable of measuring large current in a non-contact manner is sought for such a use. As such a current sensor, a sensor using a method in which a change in magnetic field is detected by a magnetic sensor has been proposed, the change being caused by a target current to be measured. For example, Japanese Unexamined Patent Application Publication No. 2002-156390 discloses a current sensor in which a magnetic resistance element is used as an element for a magnetic sensor.

For the above-described current sensor, which is a non-contact type current sensor, current-detection performance may be degraded due to deterioration of an element with age. Thus, in a field whose top priority is to ensure safety, such as in a field regarding devices mounted in vehicles, it may be necessary to determine whether a malfunction has occurred or not in the current sensor in order to realize a fail safe design. As a method for determining whether a malfunction has occurred or not in the current sensor, Japanese Unexamined Patent Application Publication No. 2003-194598 discloses a malfunction detection method in which determination is performed in accordance with whether the sum of output values from two sensors (an addition value of output values) is constant or not.

However, an addition value of output value used to perform malfunction determination in Japanese Unexamined Patent Application Publication No. 2003-194598 changes under the influence of an adscititious magnetic field (the earth's magnetic field, an induction field generated by current that flows through an adjacent wire, or the like). Thus, in the case where, for example, the influence due to a malfunction is almost at the same level as or is smaller than the influence due to an adscititious magnetic field, the influence due to the malfunction is masked by the influence due to the adscititious magnetic field. Consequently, malfunction determination is not properly performed.

SUMMARY OF THE INVENTION

The present invention has been made in light of the above-described issues. The present invention provides a current sensor capable of performing malfunction determination with high accuracy under the influence of an adscititious magnetic field.

The present invention provides a current sensor including: a first current sensor unit configured to measure a target current to be measured flowing through a current wire; a second current sensor unit configured to have almost the same sensitivity as the first current sensor unit; a computation unit configured to calculate and output an addition value of and a difference value between outputs of the first current sensor unit and the second current sensor unit; a storage unit configured to store the addition value and the difference value output from the computation unit; and a determination processing unit configured to perform determination as to whether a malfunction has occurred or not, by using the addition value and the difference value stored in the storage unit. The determination processing unit may determine that a malfunction has occurred, in a case where there is a correlation between the addition value and the difference value.

With this structure, it is determined that a malfunction has occurred, in the case where there is a correlation between addition values and difference values of outputs of two sensors. Thus, the influence of a factor, such as an adscititious magnetic field, that appears similarly in outputs of the two sensors may be significantly reduced. As a result, malfunction determination may be performed with high accuracy even under the influence of an adscititious magnetic field or the like.

The determination processing unit may compare an addition value calculated at a first timing with an addition value calculated at a second timing subsequent to the first timing, determine whether the trend of the addition values is upward or downward, compare a difference value calculated at the first timing with a difference value calculated at the second timing, determine whether the trend of the difference values is upward or downward, and perform matching-difference determination as to whether the trend of the addition values matches or differs from the trend of the difference values. As a result of performing the matching-difference determination by using a plurality of addition values and a plurality of difference values calculated sequentially, the determination processing unit may determine that a malfunction has occurred, in a case where the number of consecutive times that the trend of addition values has matched the trend of difference values or the number of consecutive times that the trend of addition values has differed from the trend of difference values has reached a predetermined number.

With this structure, it is possible to determine whether a malfunction has occurred or not after performing of measurement a relatively small number of times. Thus, the storage unit, in which addition values and difference values are stored, does not need a large capacity. In addition, whether a malfunction has occurred or not may be promptly determined.

The determination processing unit may determine that a malfunction has occurred, in a case where the trend of addition values has matched the trend of difference values 10 times in a row or the trend of addition values has differed from the trend of difference values 10 times in a row.

The determination processing unit may calculate a correlation coefficient between addition values and difference values from a plurality of addition values and a plurality of difference values calculated sequentially. The determination processing unit may determine that a malfunction has occurred, in a case where the absolute value of the correlation coefficient is larger than a predetermined value.

With this structure, the accuracy of malfunction determination may be further improved by calculating a correlation coefficient from a large number of addition values and difference values and performing malfunction determination.

The determination processing unit may determine that a malfunction has occurred, in a case where the absolute value of the correlation coefficient is larger than 0.2.

The determination processing unit may calculate correlation coefficients between addition values and difference values from a plurality of addition values and a plurality of difference values calculated sequentially. The determination processing unit may determine that a malfunction has occurred, in a case where the number of consecutive times that the absolute value of the correlation coefficient is larger than a predetermined value has reached a predetermined number.

With this structure, a correlation coefficient may be calculated from a small number of measurement results and malfunction determination may be performed by using a plurality of calculated correlation coefficients. Thus, whether a malfunction has occurred or not may be promptly determined with high accuracy. Alternatively, a correlation coefficient may be calculated from a large number of measurement results and malfunction determination may be performed by using a plurality of calculated correlation coefficients. Thus, malfunction determination may be performed with higher accuracy.

The determination processing unit may determine that a malfunction has occurred, in a case where the absolute value of the correlation coefficient is larger than 0.2 two times in a row.

Each of the first current sensor unit and the second current sensor unit may have a magnetic sensor element. The first current sensor unit and the second current sensor unit may be arranged such that the first current sensor unit and the second current sensor unit output signals upon receiving an induction field generated by the target current to be measured flowing through the current wire, the polarity of a signal output by the first current sensor unit being opposite to the polarity of a signal output by the second current sensor unit.

Each of the first current sensor unit and the second current sensor unit may have a magnetic sensor element. The first current sensor unit and the second current sensor unit may be arranged such that the first current sensor unit and the second current sensor unit output signals upon receiving an induction field generated by the target current to be measured flowing through the current wire, the polarity of a signal output by the first current sensor unit being the same as the polarity of a signal output by the second current sensor unit.

The magnetic sensor element may be a magnetoresistive element.

BRIEF DESCRIPTION OF THE DRAWINGS

FIGS. 3A and 3B are schematic diagrams illustrating examples of arrangement of current sensor units according to the embodiment;

DESCRIPTION OF THE PREFERRED EMBODIMENTS

In the following, preferred embodiments will be described in detail with reference to drawings.

Figure 1:
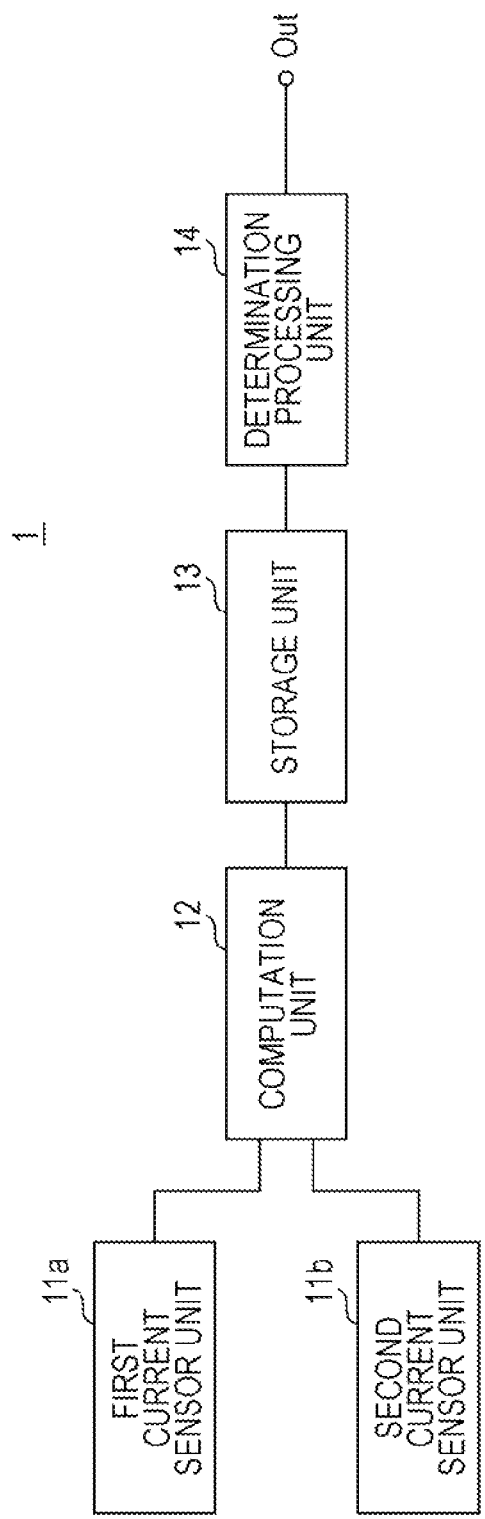
FIG. 1 is a block diagram illustrating an example of the structure of a current sensor according to an embodiment.

FIG. 1 is a schematic diagram illustrating an example of the structure of a current sensor according to a preferred embodiment of the present invention. A current sensor 1 illustrated in FIG. 1 includes a current sensor unit (a first current sensor unit) 11$a$, a current sensor unit (a second current sensor unit) 11$b$, a computation unit 12, a storage unit 13, and a determination processing unit 14. The current sensor units 11$a$ and 11$b$ measure a current value of a target current to be measured flowing through a current wire (not illustrated). The computation unit 12 calculates the sum (an addition value) of and the difference (a difference value) between output values from the current sensor units 11$a$ and 11$b$. The storage unit 13 is a storage unit in which an addition value and a difference value calculated by the computation unit 12 are stored. The determination processing unit 14 performs determination as to whether a malfunction has occurred or not, by using an addition value and a difference value stored in the storage unit 13. Such determination is hereinafter simply referred to as "malfunction determination".

The current sensor units 11$a$ and 11$b$ are configured to have almost the same sensitivity. Here, "almost the same sensitivity" refers to a case where when current is measured under the influence of a phenomenon, the influence of the phenomenon appears similarly in outputs of the current sensor units 11$a$ and 11$b$. For example, each of the current sensor units 11$a$ and 11$b$ may include a magnetic sensor element and a current value is calculated under the influence of an induction field. In this case, "almost the same sensitivity" refers to a case where outputs obtained from the current sensor units 11$a$ and 11$b$ are almost the same when the current sensor units 11$a$ and 11$b$ are under the influence of the same induction field. Moreover, cases where the current sensor units 11$a$ and 11$b$ have almost the same sensitivity include a case in which there is a difference between the sensitivity of the current sensor unit 11$a$ and the sensitivity of the current sensor unit 11$b$, the difference being at an acceptable level in current measurement.

In this way, when the current sensor units 11$a$ and 11$b$ have almost the same sensitivity, malfunction determination may be performed for the current sensor 1 as described below using an addition value of and a difference value between outputs from the current sensor units 11a and 11b. Note that, as the current sensor units 11a and 11b, current sensor units configured to directly measure a current value by using a shunt resistor or the like may be used other than current sensor units configured to measure a current value in a non-contact manner by using a magnetic sensor element or the like. In the following, the case where current measurement is performed in a non-contact manner will be described in detail.

Figure 2:
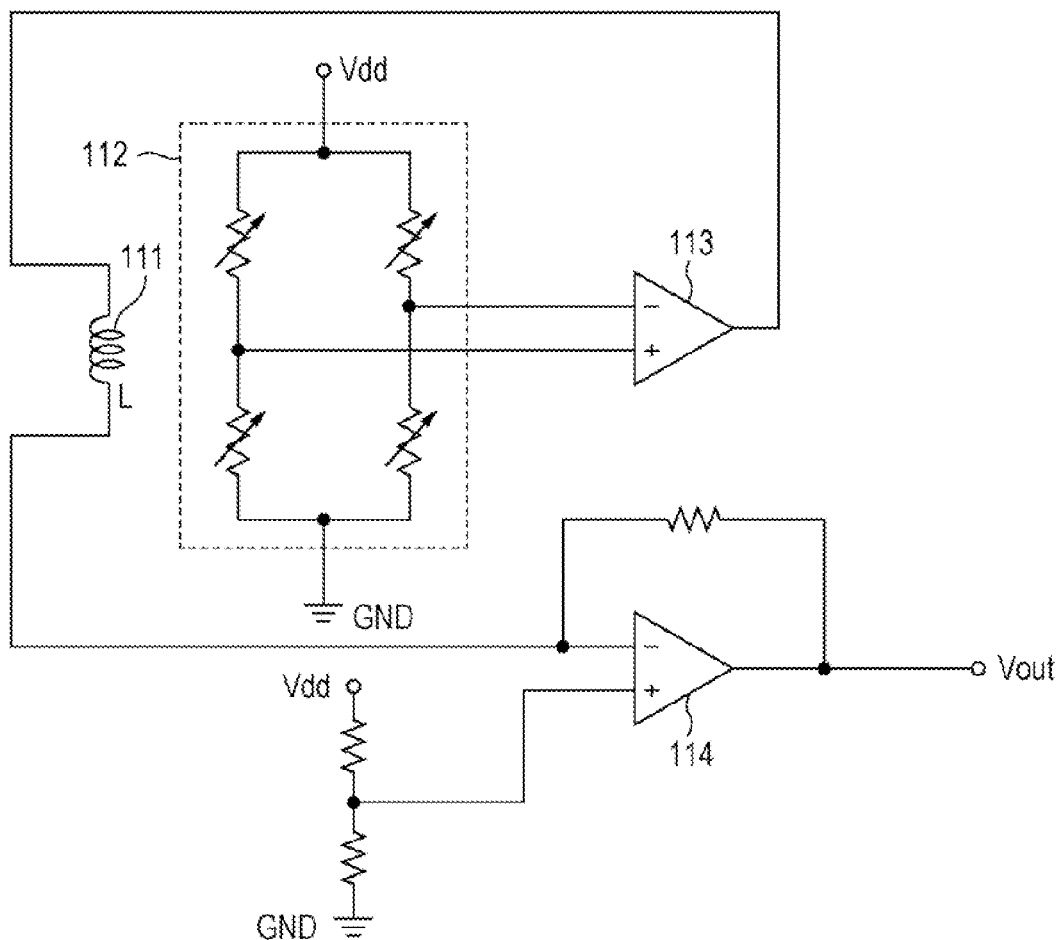
FIG. 2 is a circuit diagram illustrating an example of the structure of a current sensor unit according to the embodiment.

FIG. 2 is a circuit diagram illustrating an example of the structure of each of the current sensor units 11a and 11b, which perform current measurement in a non-contact manner. The current sensor units 11a and 11b illustrated in FIG. 2 are closed loop current sensor units. The current sensor units 11a and 11b include a feedback coil 111, a bridge circuit 112, a differential current amplifier 113, and an I/V amplifier 114. The feedback coil 111 is capable of generating a magnetic field that cancels an induction field generated by a target current to be measured, the direction of the magnetic field being opposite to that of the induction field. The bridge circuit 112 may include four magnetoresistive elements as magnetic sensor elements. The differential current amplifier 113 amplifies a differential output from the bridge circuit 112 and controls a feedback current for the feedback coil 111. The I/V amplifier 114 converts a feedback current into a voltage.

The feedback coil 111 is arranged near the four magnetoresistive elements included in the bridge circuit 112 and generates a cancelling magnetic field. A cancelling magnetic field cancels an induction field generated by a target current to be measured.

The bridge circuit 112 may include four magnetoresistive elements and functions as a magnetic sensor. Note that the structure of the bridge circuit 112 is not limited this. It is desirable that the bridge circuit 112 may have at least one magnetoresistive element and function as a magnetic sensor. As a magnetoresistive element of the bridge circuit 112, a giant magnetoresistance (GMR) element or a tunnel magnetoresistance (TMR) element may be used. A magnetoresistive element has a characteristic that its resistance changes due to an induction field generated by a target current to be measured. Thus, an electric potential difference between two outputs determined by two electric potentials applied to the bridge circuit 112 and the resistance of magnetoresistive elements that may be included in the bridge circuit 112 has a value corresponding to an induction field.

The differential current amplifier 113 amplifies the difference between two outputs from the bridge circuit 112 and supplies a resulting current as a feedback current to the feedback coil 111. When a feedback current is supplied to the feedback coil 111, a cancelling magnetic field, which cancels an induction field, is generated by the feedback current.

When an equilibrium state in which an induction field is cancelled by a cancelling magnetic field is reached, the I/V amplifier 114 converts a current that flows in the feedback coil 111 into a voltage and outputs the voltage as an output of the current sensor units 11a and 11b.

FIGS. 3A and 3B are schematic diagrams illustrating examples of arrangement of the current sensor units 11a and 11b in the current sensor 1. The current sensor units 11a and 11b are arranged close to a current wire 2 such that the current sensor units 11a and 11b receive an induction field generated by a target current to be measured flowing through the current wire 2. In FIGS. 3A and 3B, the current wire 2 is arranged such that current I flows in a depth direction from the front side of the sheet toward the back side of the sheet. The shape of the current wire 2 is almost rectangular in cross-section. Moreover, the current sensor units 11a and 11b are arranged on a printed circuit board 3 in such a manner that the current wire 2 is positioned between the current sensor units 11a and 11b. Thus, the direction of an induction field A received by the current sensor unit 11a is opposite to the direction of the induction field A received by the current sensor unit 11b. In contrast, the direction of an adscititious magnetic field B received by the current sensor unit 11a is the same as the direction of the adscititious magnetic field B received by the current sensor unit 11b.

In FIG. 3A, the current sensor units 11a and 11b (in particular, the bridge circuit 112 as a magnetic sensor) are arranged in such a manner the sensing direction of the current sensor unit 11a is the same as the sensing direction of the current sensor unit 11b. Thus, the current sensor units 11a and 11b may output signals upon receiving of an induction field A generated by a target current to be measured flowing through the current wire 2, the polarity of a signal output by the current sensor unit 11a being opposite to the polarity of a signal output by the current sensor unit 11b. Here, since the current sensor units 11a and 11b have almost the same sensitivity, the absolute values of two outputs generated by the induction field A are almost the same. In FIG. 3B, the current sensor units 11a and 11b (in particular, the bridge circuit 112 as a magnetic sensor) are arranged in such a manner the sensing direction of the current sensor unit 11a is opposite to the sensing direction of the current sensor unit 11b. The current sensor units 11a and 11b may output signals upon receiving of an induction field A generated by a target current to be measured flowing through the current wire 2, the polarity of a signal output by the current sensor unit 11a being the same as the polarity of a signal output by the current sensor unit 11b. Here, since the current sensor units 11a and 11b have almost the same sensitivity, the absolute values of two outputs generated by the induction field A are almost the same.

By using the current sensor units 11a and 11b that have the above-described structure, a current value of a target current to be measured may be obtained with high accuracy. Note that, here, a closed loop current sensor unit has been described as an example of the current sensor units 11a and 11b. However, the current sensor units 11a and 11b used in the current sensor 1 are not limited this. For example, an open loop current sensor unit, in which the feedback coil 111 is not used, may be used. Moreover, the arrangement of the current sensor units 11a and 11b is not limited the above-described arrangement as long as the current sensor units 11a and 11b are arranged to be equally influenced by a magnetic field. Furthermore, the polarity of an output of the current sensor unit 11a may be opposite to the polarity of an output of the current sensor unit 11b when the absolute values of outputs of the current sensor units 11a and 11b are almost the same.

The computation unit 12 is configured to be capable of calculating an addition value of and a difference value between outputs from the current sensor units 11a and 11b. The detailed structure of the computation unit 12 is not limited this. The computation unit 12 may be realized only by hardware or may be realized by using a general-purpose arithmetic device and software.

Figure 4A:
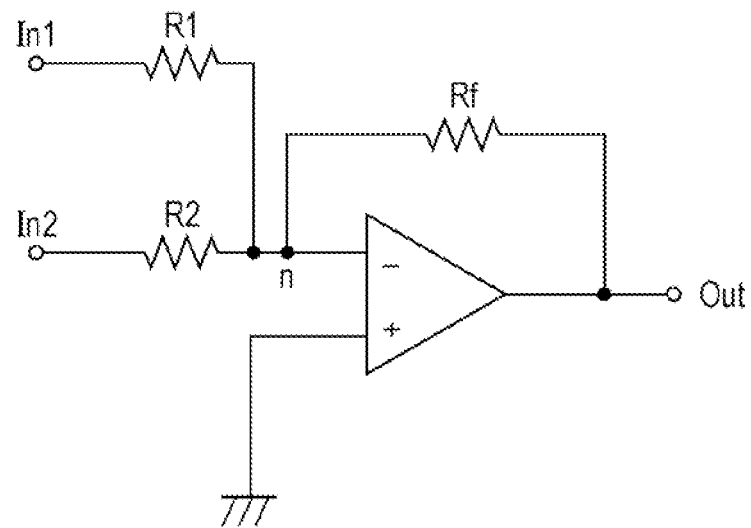
FIGS. 4A and 4B are circuit diagrams illustrating examples of the structure of an arithmetic circuit used in a computation unit according to the embodiment.
Figure 4B:
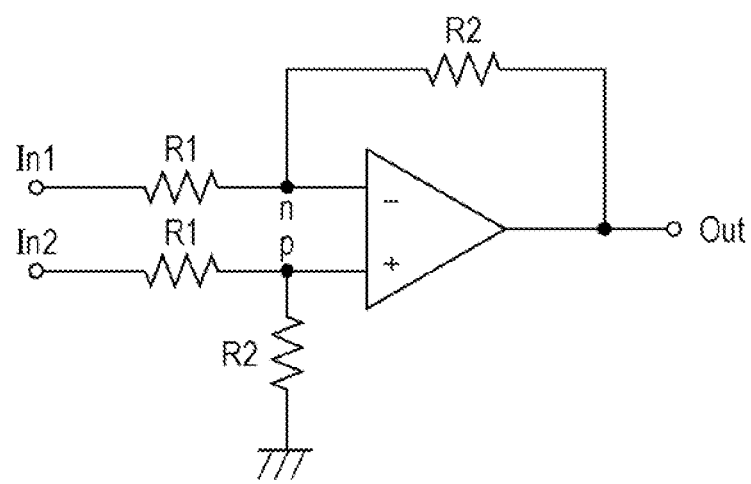

FIGS. 4A and 4B are circuit diagrams illustrating examples of the structure of an arithmetic circuit in the case where the computation unit 12 is realized only by hardware. As illustrated in FIG. 4A, an adding circuit that has an operational amplifier may be used as a circuit that calculates the sum of outputs of the current sensor units 11a and 11b. Moreover, as illustrated in FIG. 4B, a differential amplifier circuit that has an operational amplifier may be used as a circuit that calculates the difference of outputs of the current sensor units 11a and 11b. Note that, in FIGS. 4A and 4B, an output terminal of the current sensor unit 11a (or 11b) is connected to an input terminal In1 and an output terminal of the current sensor unit 11b (or 11a) is connected to an input terminal In2. Note that a connection relationship between the current sensor units 11a and 11b, the adding circuit, and the differential amplifier circuit is not limited this. There may be another circuit between the current sensor unit 11a (or 11b) and the adding circuit and there may be another circuit between the current sensor unit 11b (or 11a) and the differential amplifier circuit.

The storage unit 13 is a storage unit in which an addition value and a difference value, which are computation results of the computation unit 12, may be stored. The structure of the storage unit 13 is not particularly limited; however, the storage unit 13 needs to have a storage capacity that is enough for at least the amount of data necessary to perform malfunction determination.

The determination processing unit 14 is configured to be capable of determining that a malfunction has occurred, in the case where there is a correlation between addition values and difference values stored in the storage unit 13, the addition values and difference values being sequentially calculated by the computation unit 12. In this way, the reason why malfunction determination is performed in accordance with a correlation relationship between addition values and difference values is that a malfunction in the current sensor unit 11a or a malfunction in the current sensor unit 11b appears as a correlation between addition values and difference values.

FIGS. 5A to 6B are graphs illustrating relationships between outputs of the current sensor units 11a and 11b and difference and addition values of these outputs. Note that, in the cases illustrated in FIG. 5A to 6B, similarly as in the case illustrated in FIG. 3A, the polarity of a signal output from the current sensor unit 11a is opposite to the polarity of a signal output from the current sensor unit 11b. Moreover, in the cases illustrated in FIG. 5A to 6B, the current value of a target current to be measured increases with time.

Figure 5A:
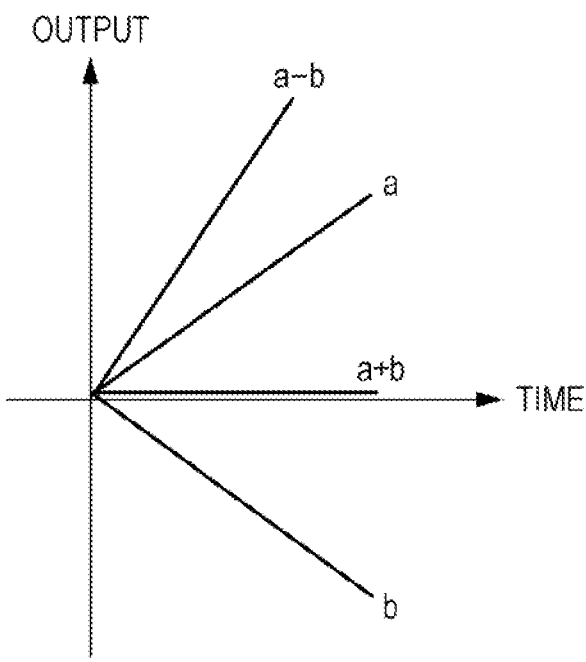
FIGS. 5A and 5B are graphs illustrating relationships between outputs of the current sensor units and difference and addition values of these outputs.

FIG. 5A illustrates changes in each of the outputs of the current sensor units 11a and 11b with time in the case where the current sensor units 11a and 11b are functioning normally. Here, the case is assumed where an output a of the current sensor unit 11a monotonically increases with time and an output b of the current sensor unit 11b monotonically decreases with time. In this case, the current sensor units 11a and 11b have almost the same sensitivity. Consequently, an addition value a+b of outputs of the current sensor units 11a and 11b is almost constant. Moreover, the slope of the line representing a difference value a-b between outputs of the current sensor units 11a and 11b is nearly twice as steep as the slope of the line representing the output a. In this way, in the case where the current sensor units 11a and 11b are functioning normally, there is almost no correlation between the addition value a+b and the difference value a-b.

Figure 5B:
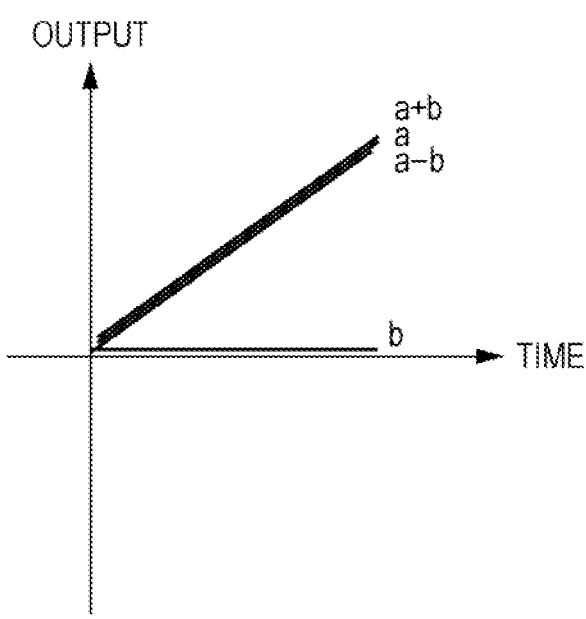
Figure 6A:
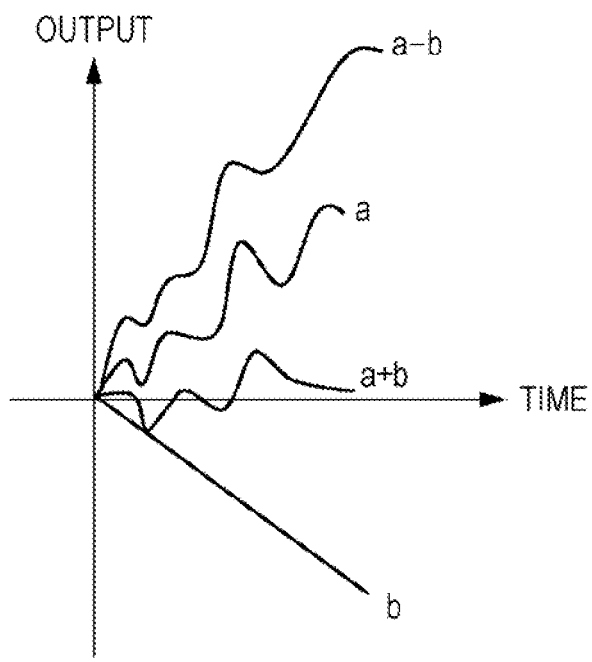
FIGS. 6A and 6B are graphs illustrating relationships between outputs of the current sensor units and difference and addition values of these outputs.

FIG. 5B illustrates changes in each of the outputs of the current sensor units 11a and 11b with time in the case where the output of the current sensor unit 11b is constant. In this case, the addition value a+b of and difference value a-b between outputs of the current sensor units 11a and 11b change in accordance with the output a. FIG. 6A illustrates changes in each of the outputs of the current sensor units 11a and 11b with time in the case where a malfunction has occurred in the current sensor unit 11a. In this case, the addition value a+b of and difference value a-b between outputs of the current sensor units 11a and 11b synchronize with the output a and change. As illustrated in FIGS. 5B and 6A, in the case where a malfunction has occurred in one of the current sensor units 11a and 11b, there is a correlation between the addition value a+b and the difference value a-b.

In this way, malfunction determination may be performed; when there is such a correlation between the addition value a+b and the difference value a-b, it is determined that a malfunction has occurred.

Figure 6B:
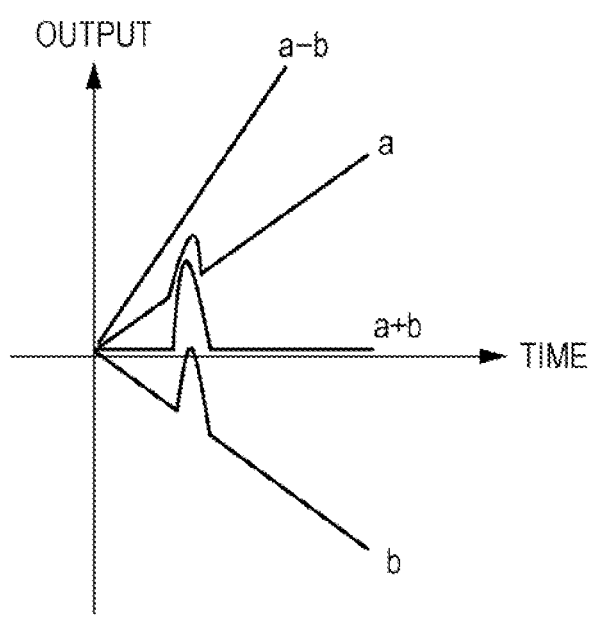

Note that, a change in outputs of the current sensor units 11a and 11b due to an adscititious magnetic field hardly affects a correlation between addition values and difference values. FIG. 6B illustrates changes in each of the outputs of the current sensor units 11a and 11b in the case where an adscititious magnetic field has been generated at a certain timing. In this case, the influence of the adscititious magnetic field appears in the addition value a+b of outputs of the current sensor units 11a and 11b. In contrast, the influence of the adscititious magnetic field does not appear in the difference values a-b between outputs of the current sensor units 11a and 11b. In this way, in the case where a malfunction has occurred in an output due to an adscititious magnetic field, there is almost no correlation between the addition value a+b and the difference value a-b. That is, the influence of an adscititious magnetic field may be significantly reduced in the case where malfunction determination is performed by using a correlation between addition values and difference values.

As described above, the determination processing unit 14 determines whether there is a correlation or not between addition values of and difference values between output of the current sensor units 11a and 11b. In the case where there is a correlation between addition values and difference values, the determination processing unit 14 determines that a malfunction has occurred. With this method, the influence of a factor, such as an adscititious magnetic field as described above, that appears similarly in outputs of the current sensor units 11a and 11b may be significantly reduced in the case where malfunction determination is performed. Thus, malfunction determination may be performed with high accuracy even under the influence of an adscititious magnetic field or the like.

Specifically, examples of the structure of the determination processing unit 14 include a first structure, a second structure, and a third structure. With the first structure, it is determined that a malfunction has occurred, in the case where an upward trend or a downward trend of addition values acquired successively has matched, respectively, an upward trend or a downward trend of difference values acquired successively or an upward trend or a downward trend of addition values acquired successively has differed from, respectively, an upward trend or a downward trend of difference values acquired successively. With the second structure, a correlation coefficient is calculated from a plurality of acquired addition values and a plurality of acquired difference values. It is determined that a malfunction has occurred, in the case where the absolute value of the correlation efficient is larger than (or equal to) a predetermined value. With the third structure, correlation coefficients are calculated from a plurality of acquired addition values and a plurality of acquired difference values. It is determined that a malfunction has occurred, in the case where the number of consecutive times that the absolute value of the correlation coefficient is larger than a predetermined value (or are larger than or equal to the predetermined value) has reached a predetermined number.

When the determination processing unit 14 has the first structure, the determination processing unit 14 may determine whether addition values have an upward trend or a downward trend by comparing an addition value acquired at a certain timing (hereinafter referred to as a first timing) with an addition value acquired at a timing subsequent to the first timing (hereinafter referred to as a second timing). Such determination is hereinafter referred to as increase-decrease determination. Moreover, the determination processing unit 14 may perform increase-decrease determination on difference values by comparing a difference value acquired at the first timing and a difference value acquired at the second timing. Moreover, by using results from the increase-decrease determination, the determination processing unit 14 may determine whether a result of the increase-decrease determination performed on the addition values matches or differs from a result of the increase-decrease determination performed on the difference values. Such determination is hereinafter referred to as matching-difference determination. Here, as a result of matching-difference determination, when a result of increase-decrease determination performed on addition values matches a result of increase-decrease determination performed on difference values, a matching-determination result is obtained. As a result of matching-difference determination, when a result of increase-decrease determination performed on addition values differs from a result of increase-decrease determination performed on difference values, a difference-determination result is obtained. The determination processing unit 14 may determine that a malfunction has occurred, for results of matching-difference determination, in the case where the number of consecutive times that the matching-determination result has been obtained has reached a predetermined number or in the case where the number of consecutive times that the difference-determination result has been obtained has reached the predetermined number. (That is, the determination processing unit 14 may determine that a malfunction has occurred, in the case where the number of consecutive times that the result of increase-decrease determination performed on the addition values has matched or differed from the result of increase-decrease determination performed on the difference values has reached a predetermined number). For example, the determination processing unit 14 may determine that a malfunction has occurred, in the case where the matching-determination result has been obtained 10 times in a row or the difference-determination result has been obtained 10 times in a row.

In this way, the determination processing unit 14 is configured to perform malfunction determination by using the number of consecutive times that the matching-determination result has been obtained or the number of consecutive times that the difference-determination result has been obtained. With such a structure, it is possible to determine whether a malfunction has occurred or not after performing of measurement a relatively small number of times. Thus, the storage unit 13, in which addition values and difference values are stored, does not need a large capacity. In addition, measurement does not have to be performed a large number of times, and consequently, whether a malfunction has occurred or not may be promptly determined.

When the determination processing unit 14 has the second structure, the determination processing unit 14 may calculate a correlation efficient from a plurality of addition values calculated sequentially and a plurality of difference values calculated sequentially. In the case where the absolute value of the correlation efficient is larger than a predetermined value, the determination processing unit 14 may determine that a malfunction has occurred. For example, the determination processing unit 14 may determine that a malfunction has occurred, in the case where the absolute value of the correlation coefficient is larger than 0.2. Note that, for calculation of a correlation efficient, it is desirable that the number of sample addition values and the number of sample difference values be larger than or equal to 100. The accuracy of malfunction determination may be improved by calculating a correlation coefficient from a large number of addition values and difference values. Note that a correlation coefficient between addition values and difference values may be expressed as Equation 1, where n is the number of samples, $x_i$ is an i-th addition value and $y_i$ is an i-th difference value, $x_i$ and $y_i$ being obtained from an i-th calculation, $\bar{x}$ is the average of addition values, and $\bar{y}$ is the average of difference values.

$$\frac{\sum_{i=1}^{n}(x_i-\bar{x})(y_i-\bar{y})}{\sqrt{\sum_{i=1}^{n}(x_i-\bar{x})^2}\sqrt{\sum_{i=1}^{n}(y_i-\bar{y})^2}} \qquad [\text{Equation 1}]$$

In this way, the determination processing unit 14 is configured to perform malfunction determination by using a calculated correlation coefficient. With such a structure, malfunction determination may be performed with higher accuracy than with the above-described structure for performing malfunction determination by using the number of consecutive times that the matching-determination result has been obtained or the number of consecutive times that the difference-determination result has been obtained.

When the determination processing unit 14 has the third structure, the determination processing unit 14 may calculate a correlation coefficient from a plurality of addition values calculated sequentially and a plurality of difference values calculated sequentially. In this respect, the third structure is the same as the second structure. Thereafter, the determination processing unit 14 may further perform calculation using addition values and difference values and may calculate a plurality of correlation coefficients. Then, the determination processing unit 14 may determine that a malfunction has occurred, in the case where the number of consecutive times that the absolute value of the calculated correlation coefficient is larger than a predetermined value has reached a predetermined number. For example, the determination processing unit 14 may determine that a malfunction has occurred, in the case where the absolute value of the correlation coefficient is larger than 0.2 two times in a row.

For calculation of correlation coefficients, the number of sample addition values and the number of sample difference values may be set to an arbitrary number. For example, in the case where one correlation coefficient is calculated from a small number (for example, 20 or less) of samples, it is ensured that determination as to whether a malfunction has occurred or not is promptly performed since a time necessary to acquire data that is necessary to calculate correlation coefficients is short. Even in this case, the accuracy may be ensured since malfunction determination is performed by using a plurality of correlation coefficients. Moreover, for example, in the case where one correlation coefficient is calculated from a large number (for example, 100 or more) of samples, malfunction determination may be performed with significantly high accuracy since malfunction determination is performed by using a plurality of correlation coefficients.

As described above, the current sensor 1 according to a preferred embodiment of the present invention determines that a malfunction has occurred, in the case where there is a correlation between addition values of and difference values between outputs of the current sensor units 11a and 11b. Thus, the influence of a factor, such as an adscititious magnetic field, that appears similarly in outputs of the current sensor units 11a and 11b may be sufficiently reduced. Thus, malfunction determination may be performed with high accuracy even under the influence of an adscititious magnetic field.

A further advantage may be obtained in accordance with the structure of the determination processing unit 14. For example, with the first structure, it is possible to determine whether a malfunction has occurred or not, after performing of measurement a relatively small number of times. Thus, the storage unit 13, in which addition values and difference values are stored, does not have to have a large capacity. Moreover, whether a malfunction has occurred or not may be promptly determined For example, with the second structure, malfunction determination is performed by using a correlation coefficient calculated using a large number of measurement results. Thus, malfunction determination may be performed with higher accuracy. Moreover, with the third structure, a correlation coefficient may be calculated from a small number of measurement results and malfunction determination may be performed by using a plurality of calculated correlation coefficients. Thus, whether a malfunction has occurred or not may be promptly determined with high accuracy. Alternatively, with the third structure, a correlation coefficient may be calculated from a large number of measurement results and malfunction determination may be performed by using a plurality of calculated correlation coefficients. Thus, malfunction determination may be performed with higher accuracy.

Figure 7:
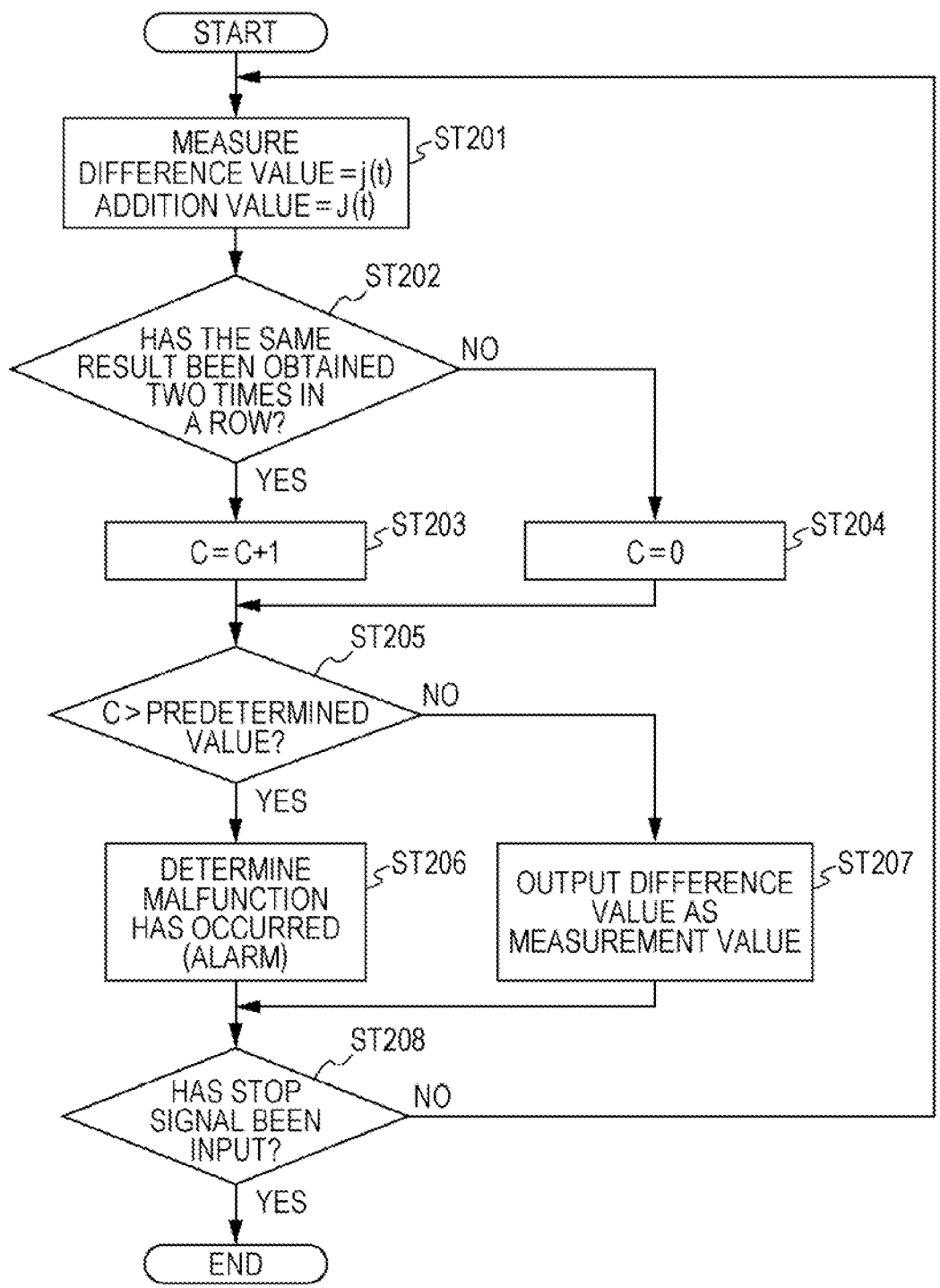
FIG. 7 is a flowchart illustrating an example of processing performed by a current sensor that performs malfunction determination by using the number of consecutive times that a matching-determination result is obtained (the number of consecutive times that a difference-determination result is obtained)

FIG. 7 is a flowchart illustrating an example of current measurement and malfunction determination performed by the current sensor 1 according to a preferred embodiment of the present invention. FIG. 7 illustrates a flow of the case where the determination processing unit 14 has the first structure, that is, in the case where malfunction determination is performed by using the number of consecutive times that the matching-determination result has been obtained (or the number of consecutive times that the difference-determination result has been obtained).

In step ST201, when the current sensor units 11a and 11b start measurement, the computation unit 12 calculates a difference value between and an addition value of outputs from the current sensor units 11a and 11b. Thereafter, the calculated difference value and the calculated addition value are stored in the storage unit 13. Such processing is consecutively performed a plurality of times. That is, the computation unit 12 calculates a plurality of difference values (j(t)) and a plurality of addition values (J(t)) expressed by a time function, from outputs of the current sensor units 11a and 11b.

In step ST202, the determination processing unit 14 determines whether a difference value (j(1)) has increased or decreased to a difference value (j(2)), determines whether an addition value (J(1)) has increased or decreased to an addition value (J(2)), and then determines whether the trend of addition values matches or differs from the trend of difference values. Here, "the trend of addition values matches the trend of difference values" refers to a case where both addition values and difference values have an upward trend or a downward trend; "the trend of addition values differs from the trend of difference values" refers to a case where addition values have an upward trend and difference values have a downward trend or a case where addition values have a downward trend and difference values have an upward trend. Note that the difference value (j(2)) is temporally subsequent to the difference value (j(1)) and the addition value (J(2)) is temporally subsequent to the addition value (J(1)). The difference values (j(1)) and (j(2)) and the addition values (J(1)) and (J(2)) are stored in the storage unit 13. Thereafter, the determination processing unit 14 determines whether a difference value (j(2)) has increased or decreased to a difference value (j(3)), determines whether an addition value (J(2)) has increased or decreased to an addition value (J(3)), and then determines whether the trend of addition values matches or differs from the trend of difference values. Note that the difference value (j(3)) is temporally subsequent to the difference value (j(2)) and the addition value (J(3)) is temporally subsequent to the addition value (J(2)). In the case where these two subsequent results of matching-difference determination are the same, that is, in the case where these two results indicate that a matching-determination result has been obtained two times in a row or that a difference-determination result has been obtained two times in a row (YES in step ST202), the determination processing unit 14 increments the number of counts C by one in step ST203. In the case where these two subsequent results of matching-difference determination are different from each other (NO in step ST202), the determination processing unit 14 resets the number of counts C to zero in step ST204.

Thereafter, in step ST205, the determination processing unit 14 determines whether the number of counts C is greater than a predetermined value. After matching-difference determination is performed a plurality of times, in the case where the number of counts C is greater than the predetermined value (YES in step ST205), the determination processing unit 14 determines that a malfunction has occurred and gives an alarm in step ST206. In the case where the number of counts C is smaller than or equal to the predetermined value (NO in step ST205), the current sensor 1 outputs a difference value between outputs of the current sensor units 11a and 11b as a measurement value (a measurement value of a target current to be measured) in step ST207. The predetermined value used as a determination standard for the number of counts C may be, for example, nine.

In step ST208, the current sensor 1 stops current measurement in the case where a stop signal has been input from the outside (YES in step ST208). In the case where a stop signal has not been input (NO in step ST208), the procedure returns to step ST201 and current measurement is executed again in step ST201.

Figure 8:
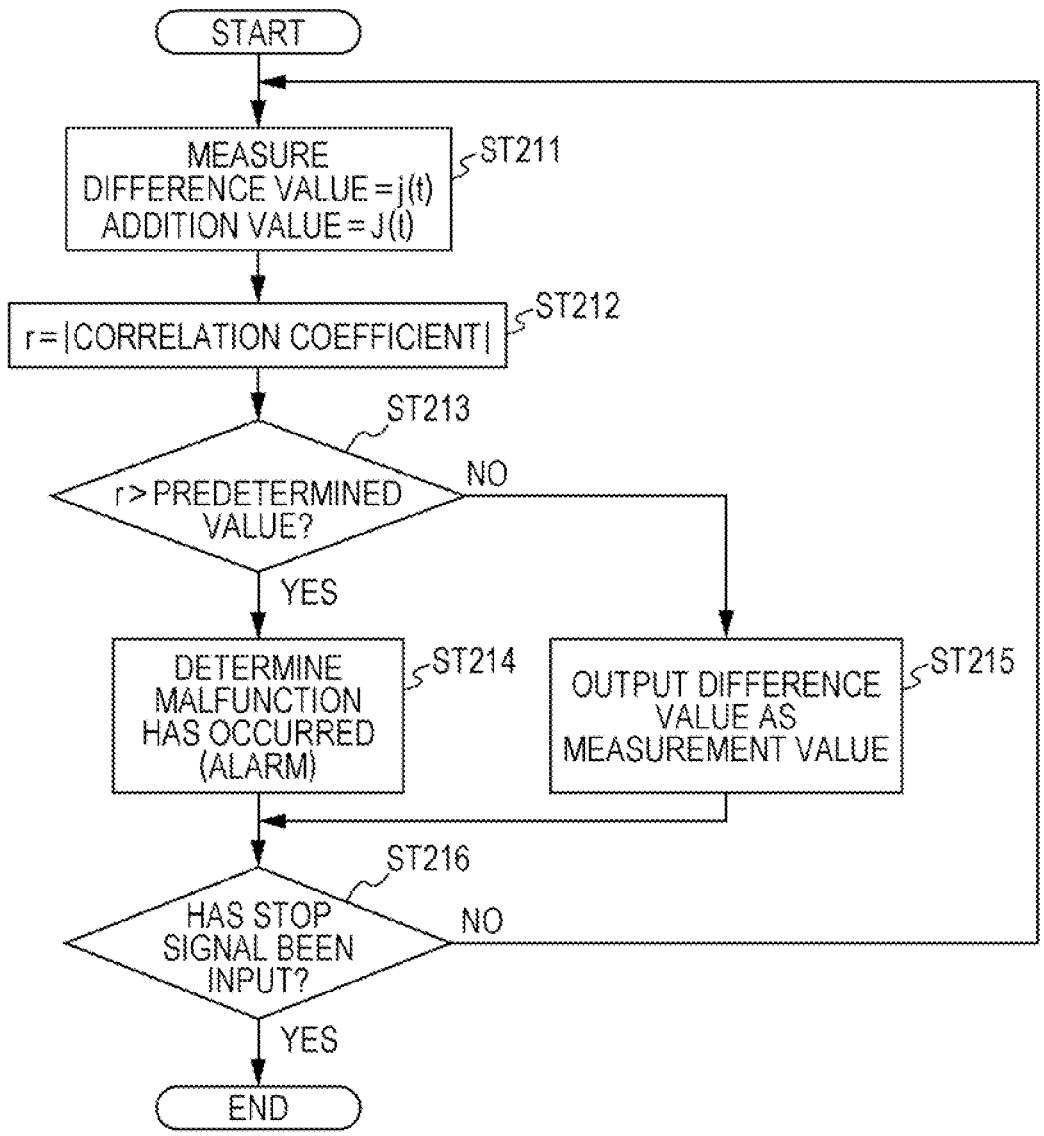
FIG. 8 is a flowchart illustrating an example of processing performed by a current sensor that performs malfunction determination by using a correlation coefficient.

FIG. 8 is a flowchart illustrating another example of current measurement and malfunction determination performed by the current sensor 1 according to a preferred embodiment of the present invention. FIG. 8 illustrates a flow of the case where the determination processing unit 14 has the second structure, that is, in the case where malfunction determination is performed by using a correlation coefficient.

In step ST211, when the current sensor units 11a and 11b start measurement, the computation unit 12 calculates a difference value between and an addition value of outputs from the current sensor units 11a and 11b. Thereafter, the calculated difference value and the calculated addition value are stored in the storage unit 13. Such processing is consecutively performed a plurality of times. That is, the computation unit 12 calculates a plurality of difference values (j(t)) and a plurality of addition values (J(t)) expressed by a time function, from outputs of the current sensor units 11a and 11b.

In step ST212, the determination processing unit 14 calculates the absolute value r of a correlation coefficient between difference values and addition values from a plurality of difference values and a plurality of addition values that are temporally subsequent to one another. In step ST213, the determination processing unit 14 determines whether the absolute value r of the correlation coefficient is greater than a predetermined value or not. In the case where the absolute value r of the correlation coefficient is greater than the predetermined value (YES in step ST213), the determination processing unit 14 determines that a malfunction has occurred and gives an alarm in step ST214. In the case where the absolute value r of the correlation coefficient is smaller than or equal to the predetermined value (NO in step ST213), the current sensor 1 outputs a difference value between outputs of the current sensor units 11a and 11b as a measurement value (a measurement value of a target current to be measured) in step ST215. The predetermined value used as a determination standard for the absolute value r of a correlation coefficient may be, for example, 0.2.

In step ST216, the current sensor 1 stops current measurement in the case where a stop signal has been input from the outside (YES in step ST216). In the case where a stop signal has not been input (NO in step ST216), the procedure returns to step ST211 and current measurement is executed again in step ST211.

Figure 9:
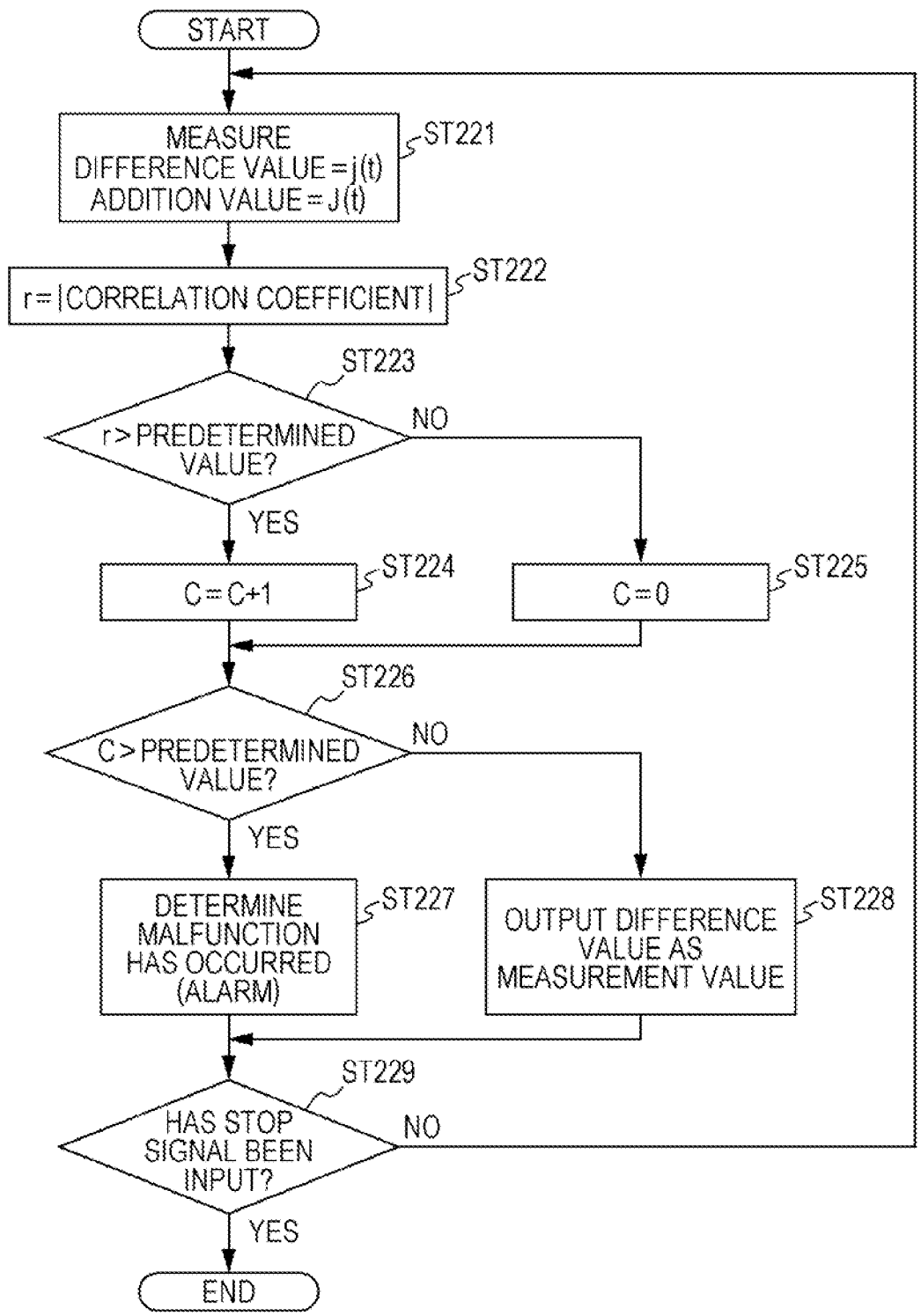
FIG. 9 is a flowchart illustrating an example of processing performed by a current sensor that performs malfunction determination by using a plurality of correlation coefficients.

FIG. 9 is a flowchart illustrating another example of current measurement and malfunction determination performed by the current sensor 1 according to a preferred embodiment of the present invention. FIG. 9 illustrates a flow of the case where the determination processing unit 14 has the third structure, that is, in the case where malfunction determination is performed by using a plurality of correlation coefficients.

In step ST221, when the current sensor units 11a and 11b start measurement, the computation unit 12 calculates a difference value between and an addition value of outputs from the current sensor units 11a and 11b. Thereafter, the calculated difference value and the calculated addition value are stored in the storage unit 13. Such processing is consecutively performed a plurality of times. That is, the computation unit 12 calculates a plurality of difference values (j(t)) and a plurality of addition values (J(t)) expressed by a time function, from outputs of the current sensor units 11a and 11b.

In step ST222, the determination processing unit 14 calculates the absolute value r of a correlation coefficient between difference values and addition values from a plurality of difference values and a plurality of addition values that are temporally subsequent to one another. The determination processing unit 14 determines whether the absolute value r of the correlation coefficient is greater than a predetermined value or not in step ST223. In the case where the absolute value r of the correlation coefficient is greater than the predetermined value (YES in step ST223), the determination processing unit 14 increments the number of counts C by one in step ST224. In the case where the absolute value r of the correlation coefficient is smaller than or equal to the predetermined value (NO in step ST223), the determination processing unit 14 resets the number of counts C to zero in step ST225. The predetermined value used as a determination standard for the absolute value r of a correlation coefficient may be, for example, 0.2.

Thereafter, in step ST226, the determination processing unit 14 determines whether the number of counts C is greater than a predetermined value. After determination has been performed for the absolute value r a plurality of times, in the case where the number of counts C is greater than the predetermined value (YES in step ST226), the determination processing unit 14 determines that a malfunction has occurred and gives an alarm in step ST227. In the case where the number of counts C is smaller than or equal to the predetermined value (NO in step ST226), the current sensor 1 outputs a difference value between outputs of the current sensor units 11a and 11b as a measurement value (a measurement value of a target current to be measured) in step ST228. The predetermined value used as a determination standard for the number of counts C may be, for example, five.

In step ST229, the current sensor 1 stops current measurement in the case where a stop signal has been input from the outside (YES in step ST229). In the case where a stop signal has not been input (NO in step ST229), the procedure returns to step ST221 and current measurement is executed again in step ST221.

Figure 10A:
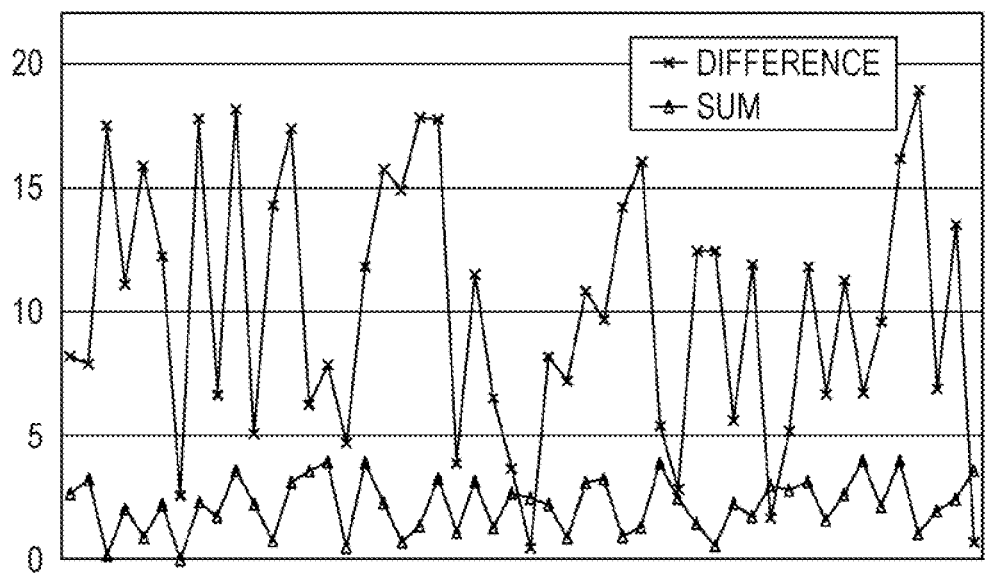
FIGS. 10A and 10B are graphs illustrating results obtained by running a simulation in a no-malfunction case (a normal case)
Figure 14A:
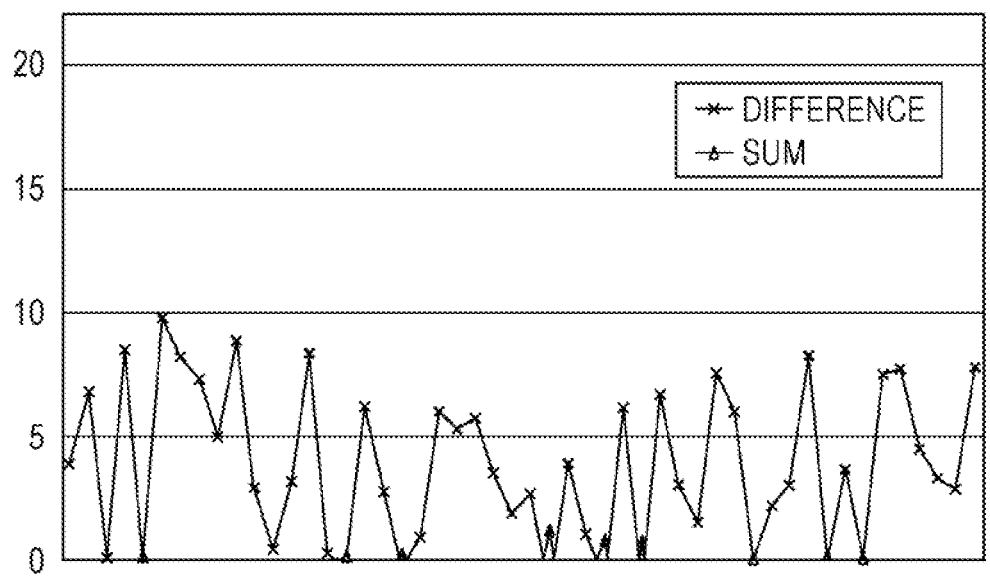
FIGS. 14A and 14B are graphs illustrating a case in which the output of a first current sensor unit is zero.
Figure 14B:
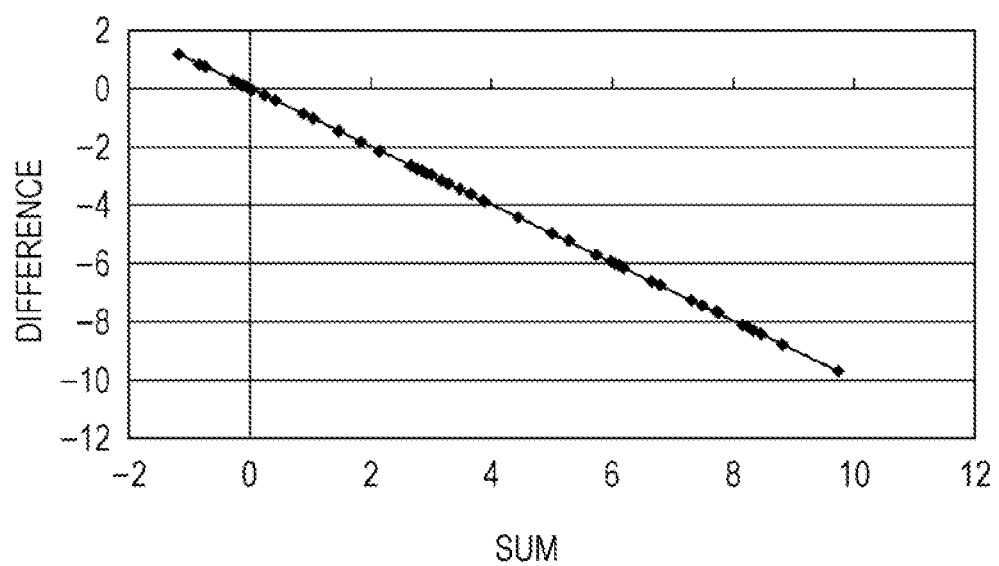

FIGS. 10A to 14B are graphs that illustrate results obtained by running simulations for which specific malfunction modes are assumed. In each of the simulations, addition values and difference values of outputs of two current sensor units are calculated in a corresponding specific malfunction mode and a correlation relationship between the addition values and the difference values is checked. FIGS. 10A and 10B illustrate a no-malfunction case (a normal case). FIGS. 11A and 11B illustrate the case of a malfunction mode in which the sensitivity of a second current sensor unit is reduced by 10%. FIGS. 12A and 12B illustrate the case of a malfunction mode in which the sensitivity of the second current sensor unit is reduced by 30%. FIGS. 13A and 13B illustrate the case of a malfunction mode in which the output of the second current sensor unit is zero. FIGS. 14A and 14B illustrate the case of a malfunction mode in which the output of a first current sensor unit is zero. FIGS. 10A, 11A, 12A, 13A, and 14A illustrate changes in an addition-value output and changes in a difference-value output with time. FIGS. 10B, 11B, 12B, 13B, and 14B are scatter diagrams that illustrate a relationship between addition values and difference values.

Figure 10B:
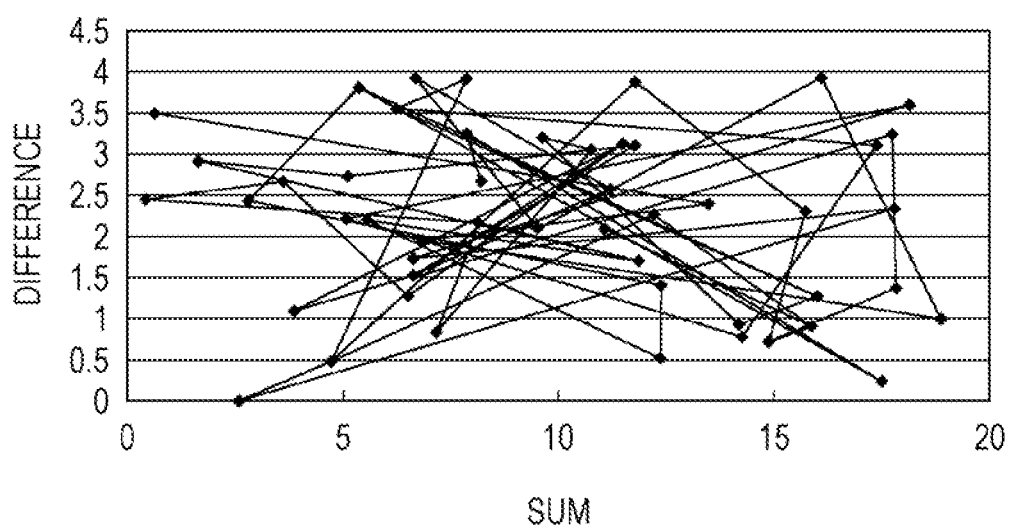

As illustrated in FIGS. 10A and 10B, in the no-malfunction case (the normal case), there was almost no correlation. Specifically, the correlation coefficient in this case was 0.057 when the number of samples was 250. Moreover, a correlation coefficient was calculated for every 10 samples, and consequently, 25 correlation coefficients were obtained. For the 25 correlation coefficients, the maximum number of consecutive times that the correlation coefficient had exceeded 0.2 was 1. In addition, for the 250 samples, the maximum number of consecutive times that the trend of addition values had matched the trend of difference values (the maximum number of consecutive times that the matching-determination result had been obtained) or the maximum number of consecutive times that the trend of addition values had differed from the trend of difference values (the maximum number of consecutive times that the difference-determination result had been obtained) was 6.

Figure 11A:
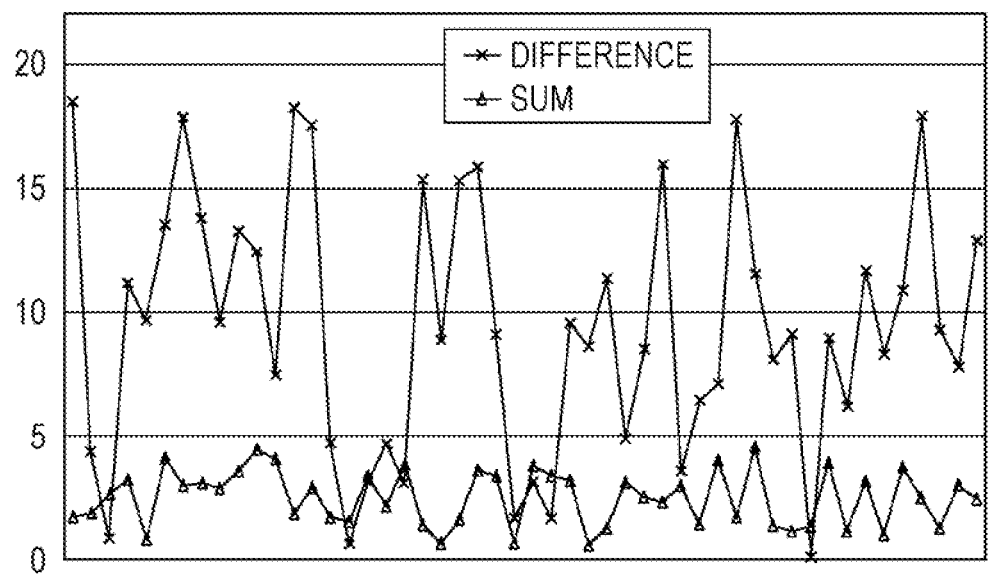
FIGS. 11A and 11B are graphs illustrating a case in which the sensitivity of a second current sensor unit is reduced by 10%.
Figure 11B:
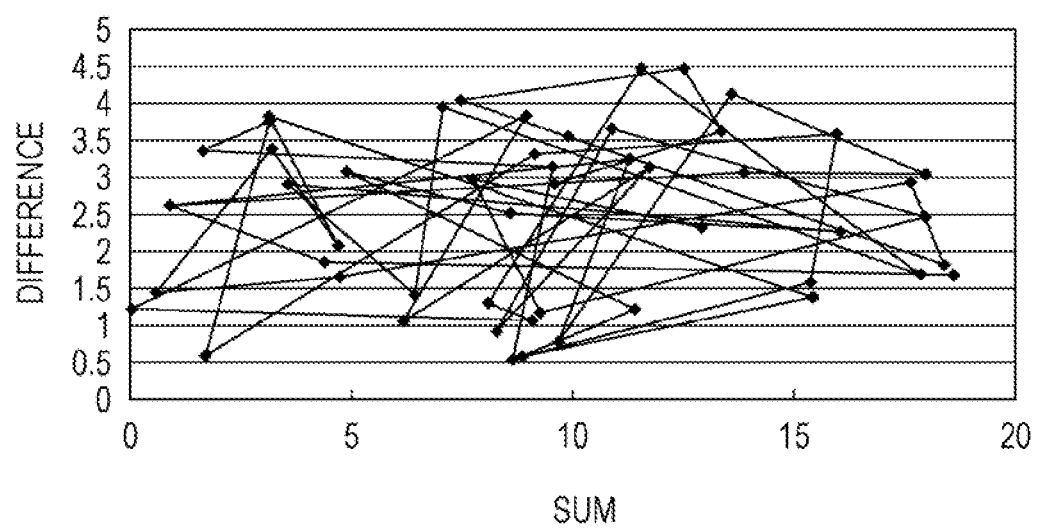

In contrast, as illustrated in FIGS. 11A and 11B, in the case of the malfunction mode in which the sensitivity of a second current sensor unit is reduced by 10%, there was a slight correlation (a weak correlation). Specifically, the correlation coefficient in this case was 0.25 when the number of samples was 250. Moreover, a correlation coefficient was calculated for every 10 samples, and consequently, 25 correlation coefficients were obtained. For the 25 correlation coefficients, the maximum number of consecutive times that a correlation coefficient had exceeded 0.2 was 2. In addition, for the 250 samples, the maximum number of consecutive times that the trend of addition values had matched the trend of difference values (the maximum number of consecutive times that the matching-determination result had been obtained) or the maximum number of consecutive times that the trend of addition values had differed from the trend of difference values (the maximum number of consecutive times that the difference-determination result had been obtained) was 11.

Figure 12A:
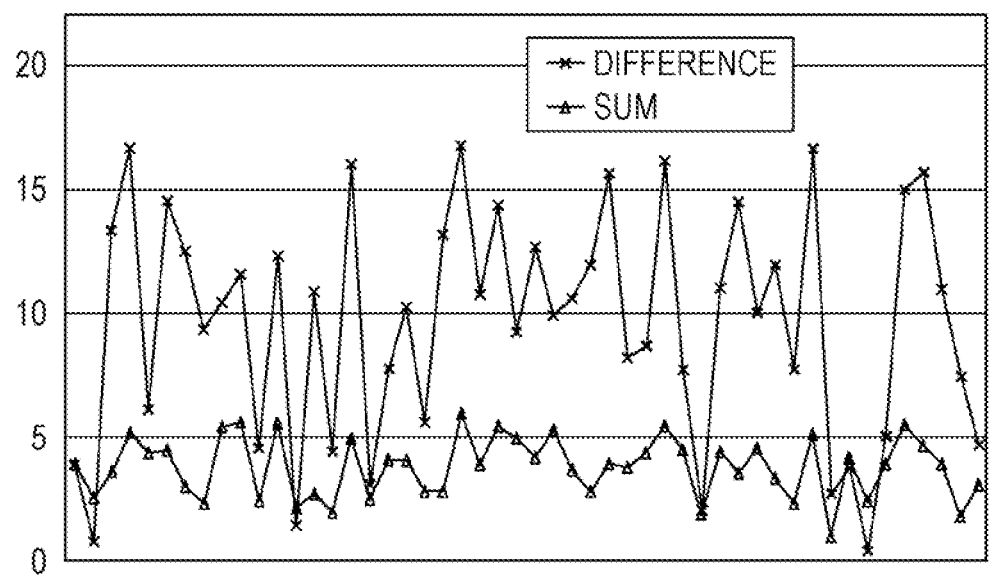
FIGS. 12A and 12B are graphs illustrating a case in which the sensitivity of the second current sensor unit is reduced by 30%.
Figure 12B:
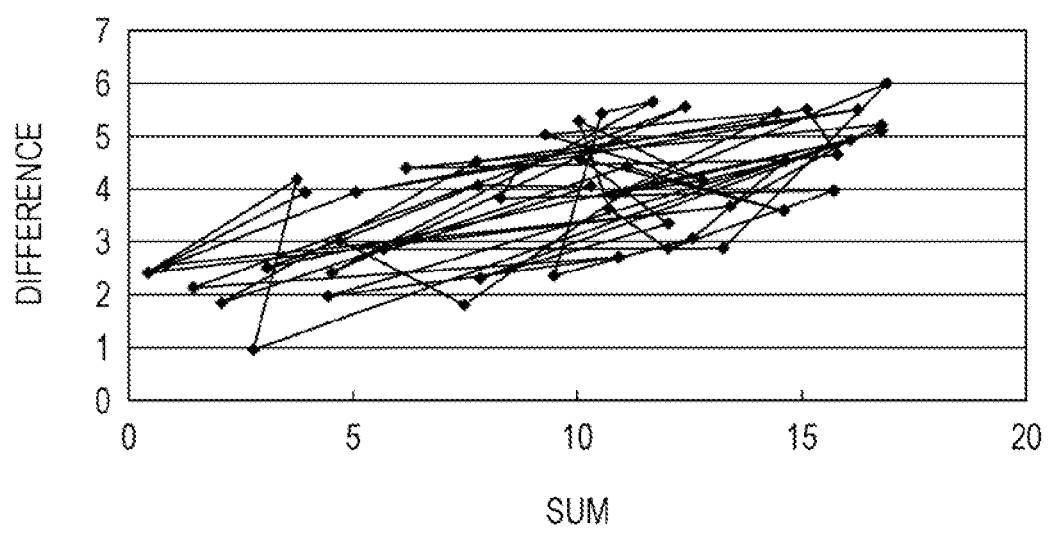
Figure 13A:
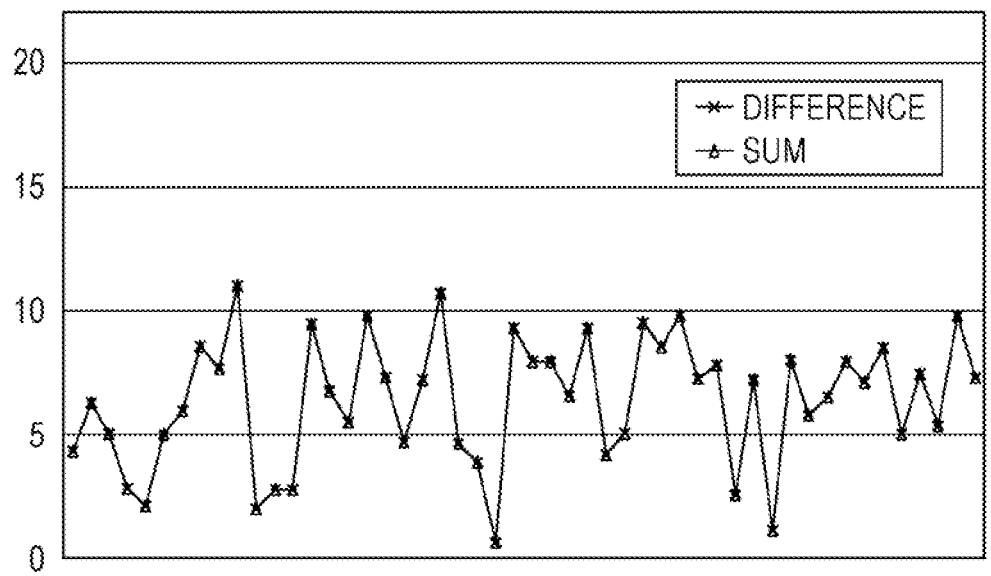
FIGS. 13A and 13B are graphs illustrating a case in which the output of the second current sensor unit is zero.
Figure 13B:
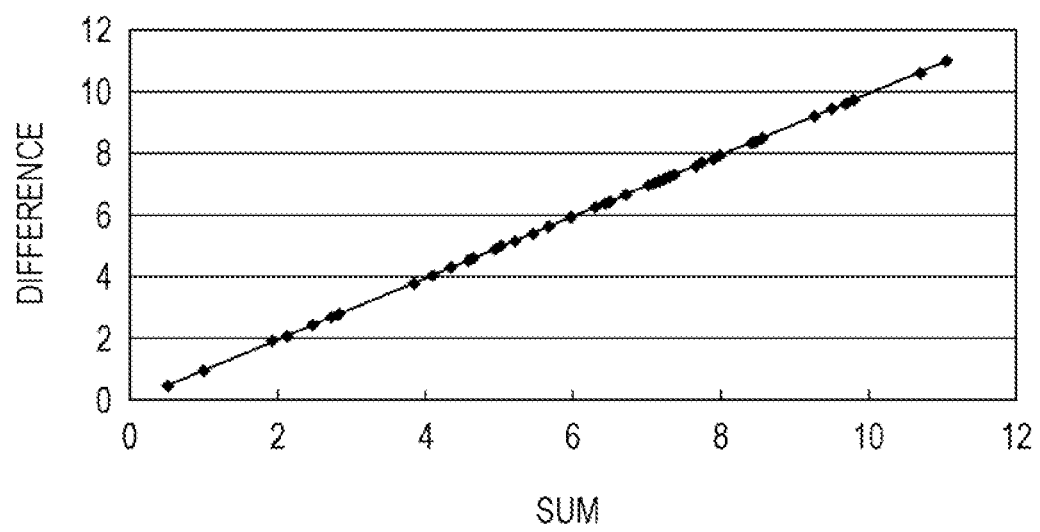

Moreover, as illustrated in FIGS. 12A and 12B, in the case of the malfunction mode in which the sensitivity of a second current sensor unit is reduced by 30%, there was a considerable correlation (a relatively strong correlation). Specifically, the correlation coefficient in this case was 0.68 when the number of samples was 250. Moreover, a correlation coefficient was calculated for every 10 samples, and consequently, 25 correlation coefficients were obtained. For the 25 correlation coefficients, the maximum number of consecutive times that a correlation coefficient had exceeded 0.2 was 24 (note that, the possible maximum number of consecutive times is 24). In addition, for the 250 samples, the maximum number of consecutive times that the trend of addition values had matched the trend of difference values (the maximum number of consecutive times that the matching-determination result had been obtained) or the maximum number of consecutive times that the trend of addition values had differed from the trend of difference values (the maximum number of consecutive times that the difference-determination result had been obtained) was 16.

Moreover, as illustrated in FIGS. 13A to 14B, in the case of malfunction modes in which the output of one of the two current sensor units is zero, there was a strong correlation. Specifically, the correlation coefficient in this case was 1 or −1 when the number of samples was 250. Moreover, a correlation coefficient was calculated for every 10 samples, and consequently, 25 correlation coefficients were obtained. For the 25 correlation coefficients, the maximum number of consecutive times that a correlation coefficient had exceeded 0.2 was 24 (note that, the possible maximum number of consecutive times is 24). In addition, for the 250 samples, the maximum number of consecutive times that the trend of addition values had matched the trend of difference values (the maximum number of consecutive times that the matching-determination result had been obtained) or the maximum number of consecutive times that the trend of addition values had differed from the trend of difference values (the maximum number of consecutive times that the difference-determination result had been obtained) was 248 (note that, the possible maximum number of consecutive times is 248).

From the results of running the above-described simulations, it was confirmed that determination as to whether a malfunction had occurred in the current sensor 1 was able to be performed by using a correlation between addition values of and difference values between outputs of the two current sensor units.

In this way, the current sensor 1 according to the preferred embodiments of the present invention determines that a malfunction has occurred, in the case where there is a correlation between addition values of and difference values between outputs of the current sensor units 11a and 11b. Thus, the influence of a factor, such as an adscititious magnetic field, that appears similarly in outputs of the current sensor units 11a and 11b, may be sufficiently reduced. Thus, malfunction determination may be performed with high accuracy even under the influence of an adscititious magnetic field.

Note that the present invention is not limited to the above-described preferred embodiments and various modifications are permissible. For example, two current sensor units are used in the above-described preferred embodiments; however, three or more current sensor units may be used. Moreover, malfunction determination may be performed in a plurality of steps by using a plurality of different standards. For example, malfunction determination is performed by using the number of consecutive times that a matching-determination result has been obtained (or the number of consecutive times that a difference-determination result has been obtained). In this case, when the number of consecutive times that the matching-determination result has been obtained (or the number of consecutive times that the difference-determination result has been obtained) is greater than C1, it is determined that caution is required. When the number of consecutive times that the matching-determination result has been obtained (or the number of consecutive times that the difference-determination result has been obtained) is greater than C2 (>C1), it is determined that a malfunction has occurred. A modification configured to be capable of performing such processing may be possible.

Moreover, connection relationships of elements, the size of each element, and the like may be arbitrarily changed as long as the concept of the invention is not changed. Moreover, the structures, methods, and the like described in the above preferred embodiments may be arbitrarily combined and realized. In addition, for the invention, various modifications may be made without departing from the scope of the invention.

What is claimed is:

1. A current sensor comprising:
    a first current sensor unit configured to measure a target current to be measured flowing through a current wire and output a first sensor output;
    a second current sensor unit having substantially a same sensitivity as that of the first current sensor unit, the second current sensor unit being configured to output a second sensor output;
    a computation unit configured to output an addition value by adding the first and second sensor outputs and a difference value by calculating a difference between the first and second sensor outputs;
    a storage unit configured to store the addition value and the difference value output from the computation unit; and
    a determination processing unit configured to determine whether a malfunction has occurred or not based on the addition value and the difference value stored in the storage unit, wherein the determination processing unit determines an occurrence of malfunction if there is a correlation between the addition value and the difference value,
    wherein the determination processing unit is configured to compare an addition value calculated at a first timing with an addition value calculated at a second timing subsequent to the first timing so as to determine whether the addition value increases or decreases, compare a difference value calculated at the first timing with a difference value calculated at the second timing so as to determine whether the difference value increases or decreases, and identify a match if both of the addition value and the difference value increase or both of the addition value and the difference value decrease, while identifying a disparity if one of the addition value and the difference value increases and the other decreases, and
    wherein, after identifying the match or the disparity multiple times using a plurality of addition values and a plurality of difference values sequentially output from the computation unit, the determination processing unit determines that a malfunction has occurred if either the match or the disparity is consecutively identified a predetermined number of times.

2. The current sensor according to claim 1,
    wherein the determination processing unit determines that a malfunction has occurred if either the match or the disparity is consecutively identified 10 times.

3. The current sensor according to claim 1,
    wherein each of the first current sensor unit and the second current sensor unit has a magnetic sensor element, the first current sensor unit and the second current sensor unit outputting the first sensor output and the second sensor output, respectively, depending upon an induction magnetic field received from the target current, and wherein the first current sensor unit and the second current sensor unit are arranged such that a polarity of the first sensor output is opposite to a polarity of the second sensor output.

4. The current sensor according to claim 3, wherein the magnetic sensor element is a magnetoresistive element.

5. The current sensor according to claim 1, wherein each of the first current sensor unit and the second current sensor unit has a magnetic sensor element, the first current sensor unit and the second current sensor unit outputting the first sensor output and the second sensor output, respectively, depending upon an induction magnetic field generated by the target current, and wherein the first current sensor unit and the second current sensor unit are arranged such that a polarity of the first sensor output is the same as a polarity of the second sensor output.

6. A current sensor comprising:
a first current sensor unit configured to measure a target current to be measured flowing through a current wire and output a first sensor output;
a second current sensor unit having substantially a same sensitivity as that of the first current sensor unit, the second current sensor unit being configured to output a second sensor output;
a computation unit configured to output an addition value by adding the first and second sensor outputs and a difference value by calculating a difference between the first and second sensor outputs;
a storage unit configured to store the addition value and the difference value output from the computation unit; and
a determination processing unit configured to determine whether a malfunction has occurred or not based on the addition value and the difference value stored in the storage unit, wherein the determination processing unit determines an occurrence of malfunction if there is a correlation between the addition value and the difference value,
wherein the determination processing unit is configured to calculate a correlation coefficient between the addition value and the difference value using a plurality of consecutive addition values and a plurality of consecutive difference values output from the computation unit, and
wherein the determination processing unit determines that a malfunction has occurred if an absolute value of the correlation coefficient is greater than a predetermined value.

7. The current sensor according to claim 6, wherein the determination processing unit determines that a malfunction has occurred if the absolute value of the correlation coefficient is greater than 0.2.

8. The current sensor according to claim 6, wherein each of the first current sensor unit and the second current sensor unit has a magnetic sensor element, the first current sensor unit and the second current sensor unit outputting the first sensor output and the second sensor output, respectively, depending upon an induction magnetic field received from the target current, and wherein the first current sensor unit and the second current sensor unit are arranged such that a polarity of the first sensor output is opposite to a polarity of the second sensor output.

9. The current sensor according to claim 6, wherein each of the first current sensor unit and the second current sensor unit has a magnetic sensor element, the first current sensor unit and the second current sensor unit outputting the first sensor output and the second sensor output, respectively, depending upon an induction magnetic field generated by the target current, and wherein the first current sensor unit and the second current sensor unit are arranged such that a polarity of the first sensor output is the same as a polarity of the second sensor output.

10. The current sensor according to claim 9, wherein the magnetic sensor element is a magnetoresistive element.

11. A current sensor comprising:
a first current sensor unit configured to measure a target current to be measured flowing through a current wire and output a first sensor output;
a second current sensor unit having substantially a same sensitivity as that of the first current sensor unit, the second current sensor unit being configured to output a second sensor output;
a computation unit configured to output an addition value by adding the first and second sensor outputs and a difference value by calculating a difference between the first and second sensor outputs;
a storage unit configured to store the addition value and the difference value output from the computation unit; and
a determination processing unit configured to determine whether a malfunction has occurred or not based on the addition value and the difference value stored in the storage unit, wherein the determination processing unit determines an occurrence of malfunction if there is a correlation between the addition value and the difference value,
wherein the determination processing unit is configured to calculate a correlation coefficient between the addition value and the difference value using a plurality of consecutive addition values and a plurality of consecutive difference values output from the computation unit, and
wherein the determination processing unit determines that a malfunction has occurred if the absolute value of the correlation coefficient is greater than a predetermined value a predetermined number of times consecutively.

12. The current sensor according to claim 11, wherein the determination processing unit determines that a malfunction has occurred if the absolute value of the correlation coefficient is greater than 0.2 twice in a row.

13. The current sensor according to claim 11, wherein each of the first current sensor unit and the second current sensor unit has a magnetic sensor element, the first current sensor unit and the second current sensor unit outputting the first sensor output and the second sensor output, respectively, depending upon an induction magnetic field received from the target current, and wherein the first current sensor unit and the second current sensor unit are arranged such that a polarity of the first sensor output is opposite to a polarity of the second sensor output.

14. The current sensor according to claim 11, wherein each of the first current sensor unit and the second current sensor unit has a magnetic sensor element, the first current sensor unit and the second current sensor unit outputting the first sensor output and the second sensor output, respectively, depending upon an induction magnetic field generated by the target current, and wherein the first current sensor unit and the second current sensor unit are arranged such that a polarity of the first sensor output is the same as a polarity of the second sensor output.

15. The current sensor according to claim 14, wherein the magnetic sensor element is a magnetoresistive element.

\* \* \* \* \*